(12) United States Patent
Philips et al.

(10) Patent No.: US 8,174,333 B1
(45) Date of Patent: May 8, 2012

(54) POWER-EFFICIENT SPECTRUM SHAPING FOR A MAGNETIC LINK

(75) Inventors: Norbert Philips, Bertem (BE); Steven Mark Thoen, Leuven (BE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 12/984,375

(22) Filed: Jan. 4, 2011

(51) Int. Cl.
*H03C 3/00* (2006.01)

(52) U.S. Cl. ......... 332/145; 332/100; 332/103; 330/10

(58) Field of Classification Search .......... 332/100–105, 332/144, 145; 330/10
See application file for complete search history.

(56) References Cited

U.S. PATENT DOCUMENTS

| | | | |
|---|---|---|---|
| 5,604,501 A * | 2/1997 | McPartland | 341/144 |
| 2002/0053945 A1* | 5/2002 | Putzeys | 330/10 |
| 2009/0273396 A1* | 11/2009 | Nam et al. | 330/10 |
| 2011/0129037 A1* | 6/2011 | Staszewski et al. | 375/316 |

FOREIGN PATENT DOCUMENTS

| | | |
|---|---|---|
| EP | 1 271 870 A2 | 1/2003 |
| WO | 2009 001233 A1 | 12/2008 |

* cited by examiner

*Primary Examiner* — David Mis

(57) ABSTRACT

Various embodiments relate to a transmission circuit and related method of shaping the transmission spectrum of a carrier signal. The transmission circuit may comprise a plurality of switching amplifier stages that are controlled by a modulation sequence produced by a transmission (TX) modulator. The TX modulator may receive the transmission data as a sequence of bit groups and may produce a modulation sequence including a plurality of control bits that may drive each of the switching amplifier stages. In some embodiments, one or more pulse-shaping filters may modify in-phase (I) and quadrature (Q) phase components of the transmission data. The modified components may directly shape spectral content of the output signal produced by a transmission driving circuit. Higher quantities of amplifier stages included in the transmission driving circuit may add higher granularity to the shape of the spectrum of the output signal.

25 Claims, 11 Drawing Sheets

POWER-EFFICIENT SPECTRUM SHAPING FOR A MAGNETIC LINK

TECHNICAL FIELD

Various exemplary embodiments disclosed herein relate generally to wireless communication and digital transmissions.

BACKGROUND

Wireless communications systems regularly modify signals for transmission. With an applicable wireless receiver, a transmitter and a receiver may be paired in order to enable higher reliability and stability of data transferred between the devices. To work within acceptable frequency ranges, a transmitter may shape the transmission spectrum of the signal it transmits. However, to avoid amplitude and phase distortions, transmitters regularly employ linear amplifiers (e.g., Class A, Class B, Class AB, etc.) to shape the transmission spectrum of the signal while enabling amplitude and phase modulation.

In some mobile communications systems, a transmitter and receiver pair may, for example, use switching amplifiers (e.g., Class D) when sending signals. This may keep power consumption low, due to the efficiencies of the switching amplifier. However, such switching amplifiers are efficient precisely because they do not operate in a linear region; as a result, switching amplifiers have not been used as adequate replacements to shape transmission spectra, due to the distortions that come from using non-linear amplifiers.

SUMMARY

Provided are embodiments that enable efficient spectrum shaping using switching amplifiers. In particular, various embodiments enable power-efficient spectrum shaping for a magnetic link using one or more Class-D amplifiers.

A brief summary of various exemplary embodiments is presented. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in the later sections.

Various embodiments may relate to an electrical circuit comprising a plurality of switching amplifier stages that receive a plurality of driving controls and produce a plurality of shaping signals and a summing node that connects outputs of the plurality of switching amplifier stages and produces a summing signal, wherein the plurality of driving controls determine a spectral content shape of the summing signal. Various embodiments of the electrical circuit may also comprise a modulator comprising an I/Q mapper that generates in-phase band (I-band) and quadrature-phase band (Q-band) signals based on the received transmission data, at least one filter that receives the I-band or the Q-band signals and produces an I-band filtered signal or a Q-band filtered signal, and an I/Q modulator that combines the I-band and Q-band filtered signals to produce a modulated transmission signal.

Various embodiments may also relate to a method comprising receiving, by a plurality of switching amplifier stages, a plurality of driving controls, producing, by the plurality of switching amplifier stages, a plurality of shaping signals, connecting, by a summing node, outputs of the plurality of switching amplifier stages, and producing, by the summing node, a summing signal, wherein the plurality of driving controls determine a spectral content shape of the summing signal. Various embodiments of the method may also comprise receiving, by an I/Q mapper in the modulator, the transmission data, generating, by the I/Q mapper, in-phase band (I-band) and quadrature-phase band (Q-band) signals, producing, by at least one filter in the modulator that receives the I-band or the Q-band signal, an I-band filtered signal or a Q-band filtered signal, combining, by an I/Q modulator in the modulator, the I-band and Q-band filtered signals, and producing, by the I/Q modulator, a modulated transmission signal It should be apparent that, in this manner, various exemplary embodiments enable efficient shaping of a transmission spectrum by using a plurality of non-linear switching amplifiers. Particularly, by using the carrier signal to create a modulation sequence that drives the plurality of switching amplifiers, the transmitter may efficiently transmit a shaped signal that may be configured in both phase and amplitude by a transmission modulator.

BRIEF DESCRIPTION OF THE DRAWINGS

In order to better understand various exemplary embodiments, reference is made to the accompanying drawings wherein.

DETAILED DESCRIPTION

Figure 1:
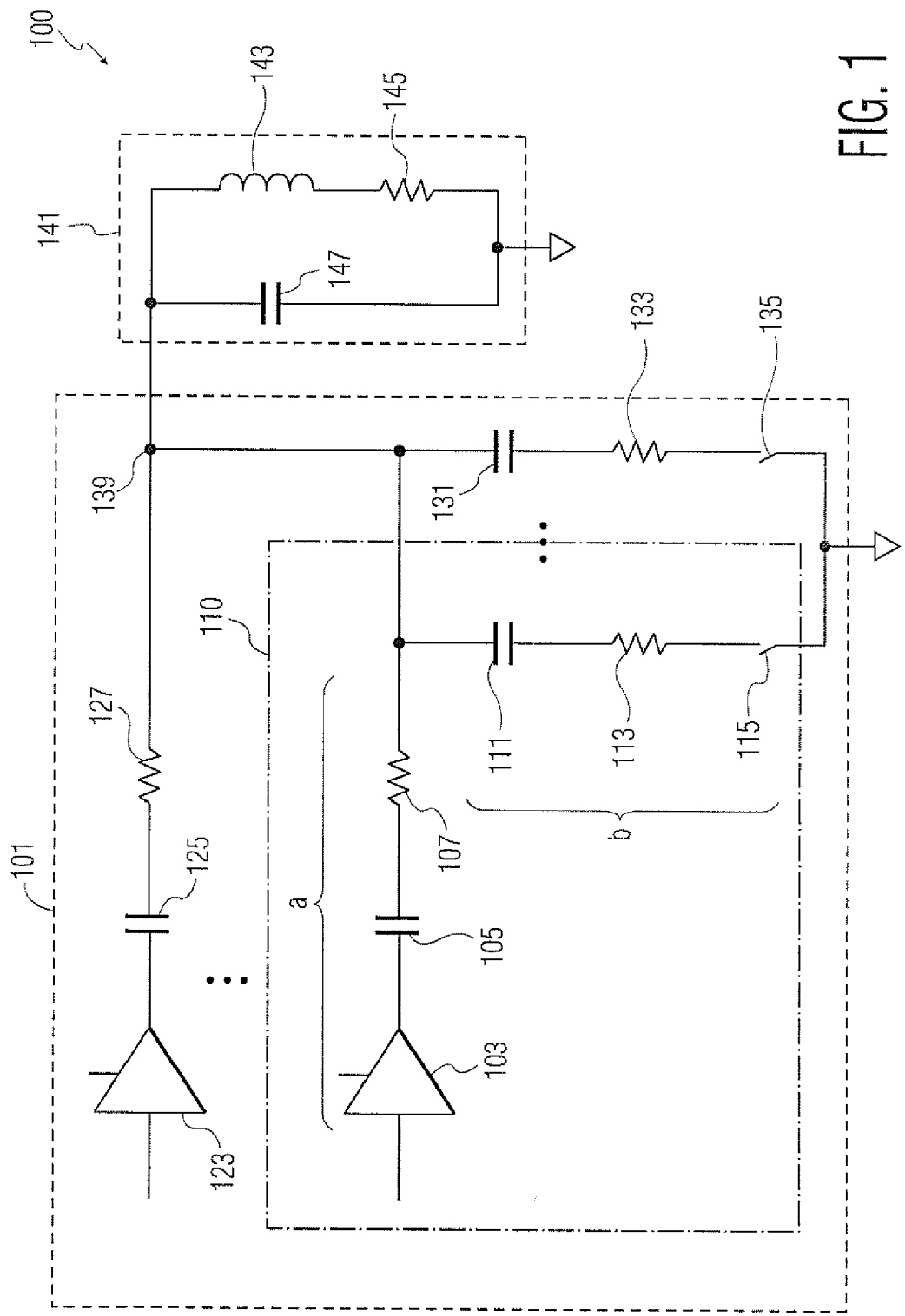
FIG. 1 illustrates an exemplary transmission circuit.

Referring now to the drawings, in which like numerals refer to like components or steps, there are disclosed broad aspects of various exemplary embodiments.

FIG. 1 illustrates an exemplary transmission circuit. Transmission (TX) circuit 100 may be a circuit included in a mobile communications device, such as a hearing aid, where the TX circuit 100 or the device may be magnetically linked to one or more paired receivers. In some embodiments, the mobile communications device that includes the TX circuit 100 may also include a receiving circuit that is paired to a similar TX circuit 100 and may enable two-way communications between devices. TX circuit 100 may comprise a TX driving circuit 101 and a coil circuit 141.

Transmission (TX) driving circuit 101 may comprise two or more interconnecting switching amplifier stages 110. For example, the driving circuit 101 may comprise 8 (i.e., $2^3$), 128 ($2^7$), or similar quantities of parallel switching amplifier stages 110. Switching amplifier stage 110 may comprise a first stage ("a") that may include a non-linear amplifier 103, a first capacitor 105, and a first resistor 107. Switching amplifier stage 110 may also comprise a second stage ("b") that includes a second capacitor 111, a second resistor 113, and a switch 115. The components 103-115 of the amplifier stage 110 may also correspond to similar components 123-135 included in the additional amplifier stage also illustrated in the driving circuit 101. Coil circuit 141 may include a coil inductor 143, a coil resistor 145, and a coil capacitor 147. In an exemplary embodiment, the TX driving circuit 101 may produce an output signal with an amplitude and phase shaped by the switching amplifiers 110. Coil circuit 141 may receive the output signal and the coil inductor 143 may transmit the output signal with a shaped spectral content (e.g., shaped amplitude and phase) to one or more receiving devices.

TX driving circuit 101 may comprise one or more switching amplifier stages 110 that each produce a driving signal through the switching amplifiers 103, 123. While the first stage ("a") of the switching amplifier stage 110 may produce the driving signal, the second stage ("b") may be used to, for example, tune the coil circuit 141. This may be done, for example, to tune the coil circuit 141 to a target resonant frequency. The driving signals produced by each of the switching amplifier stages 110 may be combined at the node 139 as the output signal, which may be used by the inductor 143 of the coil circuit 141 as the transmission signal.

In the illustrative embodiment, for example, the non-linear amplifiers 103, 123 may receive as an input a control bit that can be updated at a given signal clock rate. When a control bit of "logic high" (e.g., a logical "1" bit) is applied to the input of a switching amplifier 103, 123, the switching amplifier 103, 123 may then switch its output to the supply rail. When a control bit of "logic low" (e.g., a logical "0" bit) is applied to the input of a switching amplifier 103,123, the switching amplifier 103, 123 may then switch its output to the ground rail. When a "logic high" control bit is applied to all of the inputs of the switching amplifiers 103, 123, the node 139 may receive an output signal from all the amplifier stages 110 and may produce a signal with maximum amplitude. When only a fraction of all amplifier stages 110 are enabled by means of "logic high" control bits (e.g., 40%) while the remaining control bits (60%) have a "logic low" level, the signal amplitude on node 139 may be proportionally lower (40% of the maximum amplitude). By varying the number of control bits with a "logic high" value over time, the signal amplitude at the output node 139 may be modulated by the switching amplifier stages 110. The amount of control bits for the TX driving circuit 101 to be set to a "logic high" value may therefore be identified as a modulation value and represented by a number or sequence in a given number base (i.e., binary, octal, decimal, etc.). By changing the modulation value over time, a shaped signal may be generated.

In some embodiments, the modulation value may be translated to a modulation sequence, being a set of control bits for the TX driver circuit 101 with the number of control bits set to a "logic high" value defined by the modulation value. As a result, the node 139 may receive an output signal with an amplitude defined by the provided modulation value.

In some embodiments, a plurality of modulation values used by the switching amplifier stages 110 within a period may represent a (oversampled) sine wave with variable amplitude and phase. In other embodiments, the plurality of modulation values may represent a transmission signal with a shaped spectrum. In some embodiments, the TX driving circuit 101 may contain an unequal number of first stages ("a") that are used to create an output signal with variable level and second stages ("b") that are used to tune the coil circuit 141.

In some embodiments, the first stage of the switching amplifier stage 110 that comprises the switching amplifier 103, the capacitor 105, and the resistor 107, may be connected to either a rail supply or ground. The actual connection to the rail supply or ground may in some embodiments be determined by a control bit. Resistor 107 in the first stage may represent the parasitic resistance associated with the switching amplifier 103. In some embodiments, the switching speed of the non-linear amplifiers 103, 123 may be controlled to reduce the harmonic content of the output on node 139.

In some instances, the switching amplifier 103 may be used in conjunction with the capacitor 105 to produce an output signal with a specific voltage. The series of amplifier stages 110 in the TX driving circuit 101 may be combined to produce an output signal with a specific peak-to-peak voltage ($V_{L,pp}$). Thus, the ratio between the capacitance in the switching amplifier stages 110 that are actually switching ($C_{TX}$) to the total capacitance of the driving circuit ($C_{TOT}$) may directly change the peak-to-peak voltage. The relationship between the peak-to-peak voltage and the relative transmission level (which is based on the capacitance ratio) may thus be linear. As such, a linear graph may be constructed with a slope illustrating this relationship.

In other embodiments, two instances of the TX driving circuit 101 may be used to create a bridge configuration, with each node of coil circuit 141 connected to a node 139 from one of the TX driving circuits 101. In such a configuration, applying a defined series of modulation values to both the TX driver circuits 101 may apply more power to the coil circuit 141.

Coil circuit 141 may receive the output signal from the node 139 and may transmit the output signal as the transmission signal through the inductor 143. In some embodiments, the inductor 143 may comprise an antenna that may wirelessly transmit the output signal that may correspond to a carrier signal with a transmission spectrum shaped by a transmission modulator and by the driving circuit 101. In some embodiments, the coil circuit 141 may act as a bandpass filter for the output signal received from the node 139. The filter characteristics may be determined by the inductor 143, the resistor 145, and the capacitor 147 in which the resistor 145 and the capacitor 147 may be parasitic components associated with the inductor 143 or a combination of parasitic components and additional physical components. When the capacitor 147 and series resistance 143 are represented in this manner, the coil circuit 141 may exhibit behavior similar to existing antennas and coils regularly used by transmitters.

Figure 2:
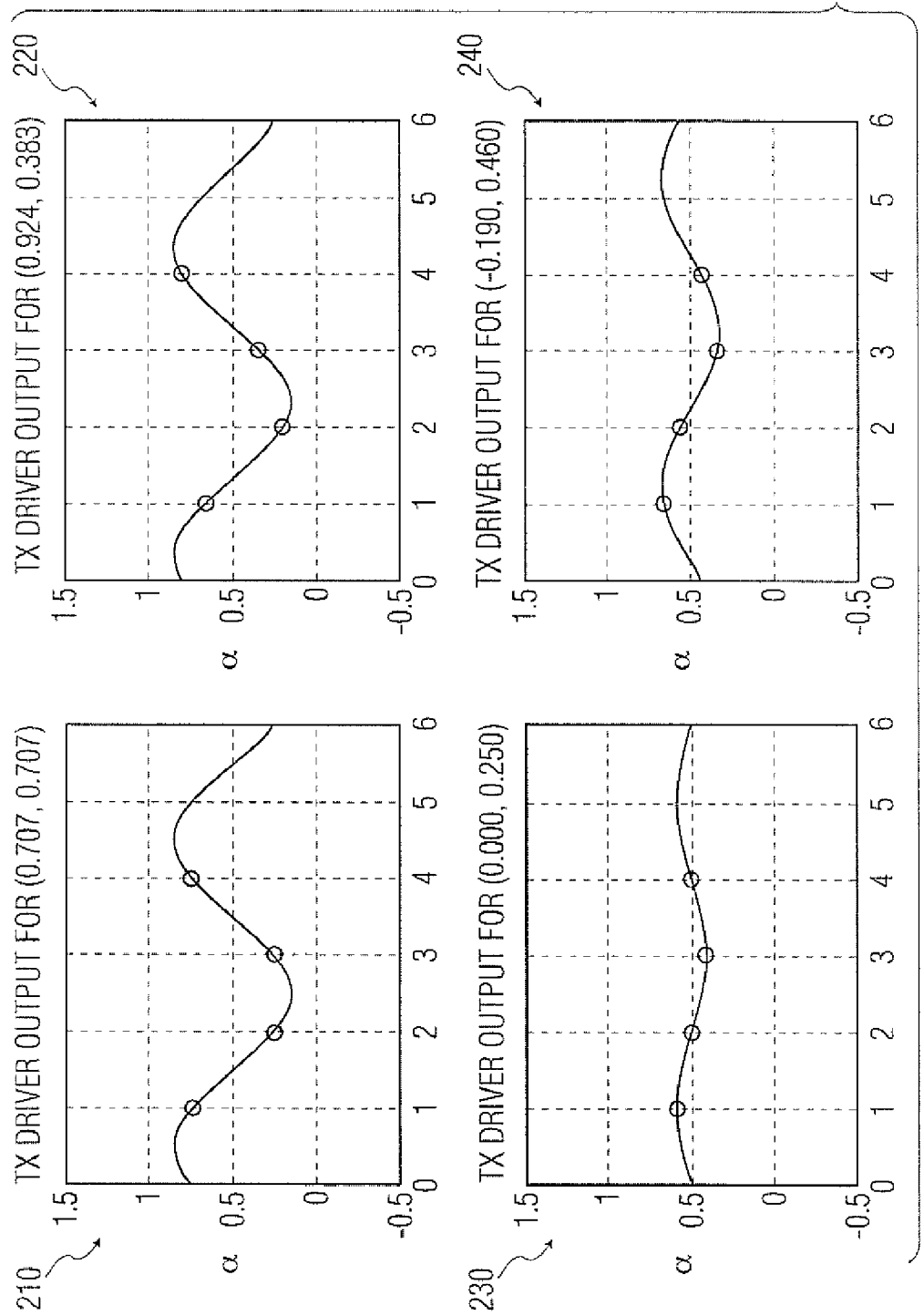
FIG. 2 illustrates an exemplary plot of modulation values $\alpha_k$ used to shape the transmission signal.

FIG. 2 illustrates an exemplary plot of modulation values (α) to control the plurality of switching amplifiers 103, 123 of the TX driving circuit 101 that may generate a sine-wave carrier signal. In some embodiments, the output signal produced by the TX driving circuit 101 may change one or more times within the period of the carrier signal. For example, the plots 210-240 illustrate multiple ways in which the output signal changes based on the modulation value. A sine wave in each of the plots 210-240 may be produced to fit the four sample points corresponding to different modulation values used during the period of the carrier wave. With the carrier wave period split into two or more sub-parts, varying the sample point in each sub-part may change the corresponding sine wave that fits the sample points. In alternative embodiments, a square wave may be produced that matches the sample points.

For example, the plots 210-240 illustrate various exemplary sample points and the resultant sine waves for four distinct sets of (I, Q) modulation values. In the illustrative embodiment, each of the sample points corresponds to an I and Q coordinate produced by a transmission (TX) modulator that employs a quadrature phase-shifted keying (QPSK) scheme to modulate the carrier signal. In the TX modulator, incoming bits may be converted to a corresponding set of in-phase (I) and quadrature (Q) values. For example, an incoming data stream may contain the bit sequence (0, 0), which the TX modulator may convert to a (1, 1) set of I and Q values. Similarly, (1, 0), (1, 1), and (0, 1) bit sequences may correspond to (−1, 1), (−1, −1), and (1, −1) I/Q sets, respectively. In some embodiments, the sequence of such I/Q sets may be applied to a filter for shaping the harmonic content of the I/Q signals. The amplitude of the filtered I/Q signals may have an amplitude ranging between −1 and 1. In the illustrative embodiment, each of the sample points in the plots 210-240, having a modulation value α, may be produced from such a filtered I/Q signal by means of an I/Q modulator.

In an exemplary embodiment, the modulation value α may be calculated from the I/Q set based on the equation:

$$\alpha(n, k) = I(n)\cos\left(\frac{2\pi k}{4}\right) - Q(n)\sin\left(\frac{2\pi k}{4}\right) = A(n)\cos\left[\frac{2\pi k}{4} + \theta(n)\right]$$

where k is a number related to the number of sub-parts in the carrier period. In the illustrative embodiments 210-240, for example, k={0, 1, 2, 3}, as the period has four equal sub-parts. Thus, each of the cos(2πk/4) and sin(2πk/4) produce values from the group {−1, 0, 1}. As a result, the amplitude and phase of the resultant output signal α(n, k) may be based on the (filtered) I/Q set, as shown by the second part of the equation. The amplitude and phase may be calculated from the (filtered) I/Q set using the equations:

$$A(n) = \sqrt{I(n)^2 + Q(n)^2}$$

$$\theta(n) = \tan^{-1}(Q(n)/I(n))$$

In some embodiments, the modulation value α may be a fractional value. As will be discussed in further detail below in relation to FIG. 3, the fractional value may be multiplied by a maximum value ($\alpha_{max}$), with an offset added to the resultant product and quantized to a given number of bits. The set of modified values α(n,k) may represent the modulation sequence which may be converted to a corresponding thermometer code representing the input control bits for the TX driving circuit 101.

Figure 3:
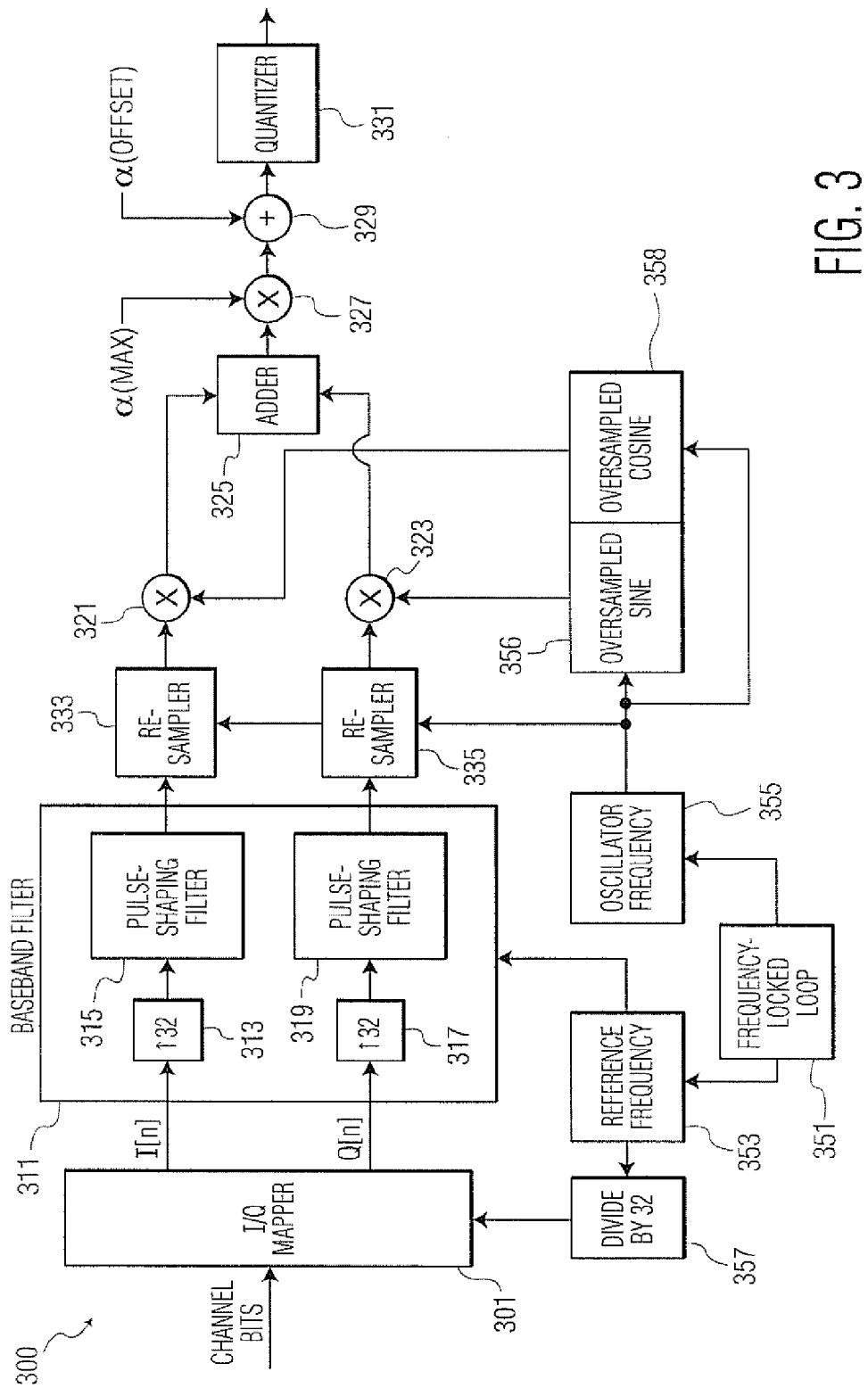
FIG. 3 illustrates an exemplary modulator that produces the driving control signals for the transmission circuit.

FIG. 3 illustrates an exemplary transmission (TX) modulator that produces the modulation sequence for the transmission circuit 100. TX modulator 300 may be a transmission modulator that may receive the data to be transmitted in the form of a series of channel bits and may produce the modulation sequence that controls the switching for the plurality of switching amplifier stages 110 in the driving circuit 101. TX modulator 300 may comprise an I/Q mapper 301, a baseband filter 311, data re-samplers 333, 335, I/Q modulators 321, 323, an adder 325, and a quantizer 331. In some embodiments, the TX modulator 300 may produce modulation sequences during a carrier period. As will be discussed in further detail below, the modulation sequence may be the quantized form of an adjusted modulation value α produced by a filtered set of I and Q values multiplied by oversampled sine and cosine values.

I/Q mapper 301 may be hardware and/or software in the TX modulator 300 that may convert incoming channel bits to corresponding in-phase (I) and quadrature (Q) phase components. In some embodiments, the I/Q mapper 301 may receive the data as a sequence of bit groups and map the bit groups on in-phase (I) and quadrature phase (Q) phase components in order to generate a given modulation constellation, such as frequency-shift keying (FSK) or various forms of phase-shift keying (e.g., BPSK, QPSK, DPSK, etc.). In the illustrative embodiment, the data may be received as a sequence of channel bit pairs. The I/Q mapper 301 may produce I/Q pairs based on the received data bit pairs, producing pairs such as (1, 1), (−1, 1), (−1, −1), or (1, −1), for the respective I and Q values. In some embodiments the I/Q mapper 301 may also receive a reference clock signal representing the symbol rate which may be obtained through the counter 357 and the reference frequency 353.

Baseband filter 311 may comprise hardware and/or software that includes a plurality of up-samplers 313, 317 and a plurality of pulse-shaping filters 315, 319, such as root-raised cosine (RRC) filters. In some embodiments, the baseband filter 311 may receive the separate I and Q values from the I/Q mapper 301 and may output filtered I and Q values by passing each of the values through the pulse-shaping filters 315, 319. In such instances, the baseband filter 311 may shape the transmission spectrum of the carrier signal through the use of the pulse-shaping filters 315, 319, the I/Q modulator 321, 323 and the adder 325. Baseband filter 311 may also receive a reference signal from the reference frequency 353, which will typically be a multiple of the symbol rate. In the illustrative embodiment, the reference frequency is 32 times higher than the symbol rate, e.g. a reference frequency of 9.6 MHz and a symbol rate of 300 kHz. In this instance, the incoming I/Q samples have been up-sampled 32 times (i.e. 31 zeros have been inserted between successive I/Q input pairs), and the pulse shaping filter 315, 319 act as an interpolating filter between the successive I/Q input pairs. As a result, the I/Q output of the pulse shaping filters 315, 319 may contain fewer harmonics than the unfiltered I/Q input (having the same value for all 32 sample points).

Pulse-shaping filters 315, 319 may be hardware and/or software that may be used by the baseband filter 311 in the TX modulator 300 to perform matched filtering, for example, by implementing the pulse-shaping filters 315, 319 as root-raised cosine (RRC) filters. In some embodiments, the receiver of the signal produced by the TX circuit 100 may include matching RRC filters to retrieve the I and Q bits. TX modulator 300 may use the pulse-shaping filters 315, 319 to alter the I and Q values produced by the I/Q mapper 301. This may be done, for example, to exert greater control over the amplitude and phase of the output signal produced by the driving circuit 101. Pulse-shaping filters 315, 319 may produce an I-band filtered sequence and a Q-band filtered sequence, respectively.

The carrier frequency, which may be modulated with the data content and transmitted by the coil circuit 141, may be generated through various methods. In the illustrative embodiment, the frequency-locked loop (FLL) 351 implemented in hardware and/or software may be used to generate an oscillator frequency 355 that is frequency-locked with the reference frequency 353 according to a given ratio. For example, the FLL 351 may set an 8:35 ratio between the reference frequency 353 and the oscillator frequency 355, resulting in an oscillator frequency of 42 MHz with a reference frequency of 9.6 MHz. In some embodiments, there may also be a set (fixed) ratio between the carrier frequency and the oscillator frequency so that the oversampled sine and cosine components 356, 358 oversample at a specific (fixed) rate. For example, the FLL 351 may lock the oscillator frequency 355 to be four times the frequency of the carrier signal. As a result, the oversampled sine and cosine components 356, 358 may oversample at four times the carrier frequency. In this instance, the resultant output of these blocks may be −1, 0, or 1 when the sample points are located at phase instances of πk/2, with k={0 . . . 3}. In this instance, the oversampled sin(πk/2) produces 0, 1, 0, and −1 over the carrier period, while the oversampled cos(πk/2) produces 1, 0, −1, and 0 over the same period. When the oscillator frequency is, for example, 42 MHz, the resulting carrier frequency will be 10.5 MHz, represented by four sample points having a rate of 42 MHz.

The IQ modulator can be implemented by means of the multiplying units 321, 323 and the adder unit 325. The output $\alpha_{init}$ of the adder unit 325 may represent the RF carrier (e.g., with a carrier frequency of 10.5 MHz) modulated with the (filtered) data content. Multiplying units 321, 323 may be hardware and/or software that multiply the I-band filtered sequence and the Q-band filtered sequence produced by the baseband filter 311 with the output of the oversampled sine and cosine components 356, 358. This result may then be added or subtracted to get the sample points of the modulated carrier.

In some embodiments, the reference frequency used by the baseband filter 311 may not be (phase) synchronized with the oscillator frequency 355 at which the multipliers 321, 323 are operated. In such instances, re-sampler blocks 333, 335 may be used to translate the filtered I/Q samples from the reference frequency clock domain to the oscillator frequency clock domain. Re-sampler blocks 333, 335 may thus preserve the I/Q values while crossing the clock domain.

Adder 325 may be followed by the multiplier 327 to scale the output $\alpha_{init}$ of the adder 325. Multiplier 327 may be similar to multipliers 321, 323 and may multiply the initial modulation value $\alpha_{init}$ produced by the adder 325 by a maximum modulation amplitude $\alpha_{max}$ to produce a scaled modulation value $\alpha_{scaled}$. Multiplier 327 may be followed by the adder 329 to add an offset value $\alpha_{offset}$ to the scaled modulation value $\alpha_{scaled}$. This may avoid negative modulation values of the modulation signal $\alpha_{mod}$. Adder 329 may be used, for example, when the output of the baseband filter 311 provides signed outputs (i.e., positive and negative values), while the input of the TX driving circuit 101 is designed to receive only positive values.

As an illustrative example, when there are 100 switching amplifier stages 110, the initial modulation value $\alpha_{init}$ may be a fraction between −1 and +1 (e.g., $\alpha_{init}$=+0.50). This value may be multiplied by the maximum allowable modulation amplitude $\alpha_{max}$, which in this example is 50. The resultant product is a scaled modulation value $\alpha_{scaled}$, equal to 0.50∙50=25. To ensure that the final modulation value $\alpha_{mod}$ will always be positive, an offset value $\alpha_{offset}$ of 50 will be added to the scaled value $\alpha_{scaled}$. Therefore, the initial value $\alpha_{init}$ of 0.50 results in a final modulation value $\alpha_{mod}$ of 75. The final modulation value may be converted to a binary number containing 75 logic-high "1" bits and 25 logic-low "0" bits (a 'thermometer' code). The logic-high bits may then cause 75 amplifiers 103, 123 to switch to the supply rail, while the remaining 25 amplifiers 103, 123 will remain connected to ground. During instances where the initial modulation value is negative (e.g. $\alpha_{init}$=−0.50), the final modulation value $\alpha_{mod}$ would be 25; 25 amplifiers 103, 123 will therefore switch to the supply rail, while the remaining 75 amplifiers 103, 123 will remain connected to ground.

In some embodiments, the multipliers 321, 323 and the adder 325 may be substituted with a multiplexer. This may be done in particular when the oversampled sine and cosine blocks 356, 358 use an oversample factor of four and the sample points are at phase instances πk/2, with k={0 . . . 3}. In such instances, the output of the oversampled sine and cosine blocks 356, 358 will have a value of either 1, 0, or −1. In such embodiments, the multiplexer may receive the filtered I and Q sequences and may select the "normal" (no sign change) or "inverted" (multiplied by −1) output from either the filtered I output or the filtered Q output to be sent to the multiplier 327.

Quantizer 331 may be hardware and/or software that may receive the scaled modulation value $\alpha_{mod}$ from the adder 329 and may convert the received value to a modulation sequence for use by the plurality of switching amplifier stages 110. For example, the quantizer 331 may use a thermometer code to convert the scaled modulation value from a (base-10) integer to a binary number containing control bits for each of the amplifier stages 110. The scaled modulation value may accordingly be converted to a number of bits indicating the number of switching amplifier stages 110 to be connected to the supply rail. For example, when the number of switching amplifier stages 110 is 8, the scaled modulation value may be a value between 0 and 8. Quantizer 331 may then produce an 8-digit binary number between "00000000" and "11111111."

In some embodiments, multiple scaled modulation sequences may be produced within the carrier period. For example, when the oscillator frequency 355 is equal to four times the reference frequency 353, the modulator 300 may produce four initial modulation values $\alpha_{init}$ according to the equation:

$$\alpha_{init,k}(n, k) = I(n)\cos\left(\frac{2\pi k}{4}\right) - Q(n)\sin\left(\frac{2\pi k}{4}\right)$$

Where k={0, 1, 2, 3}.

In other embodiments, the TX modulator 300 may produce more or less modulation sequences within a carrier period depending on the ratio between the reference frequency 353 and the oscillator frequency 355.

Figure 4A:
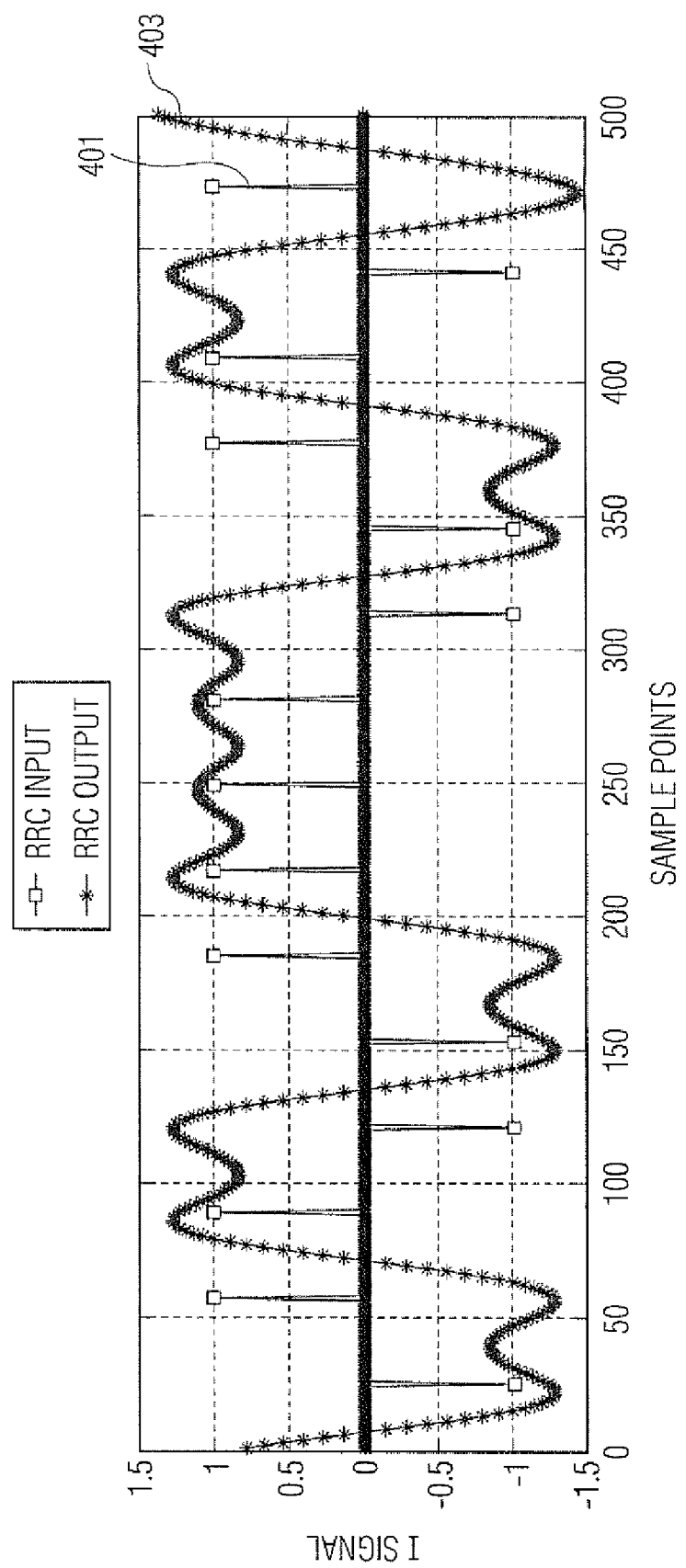
FIG. 4A illustrates a root-raised cosine (RRC) filter response to an in-phase input signal.
Figure 4B:
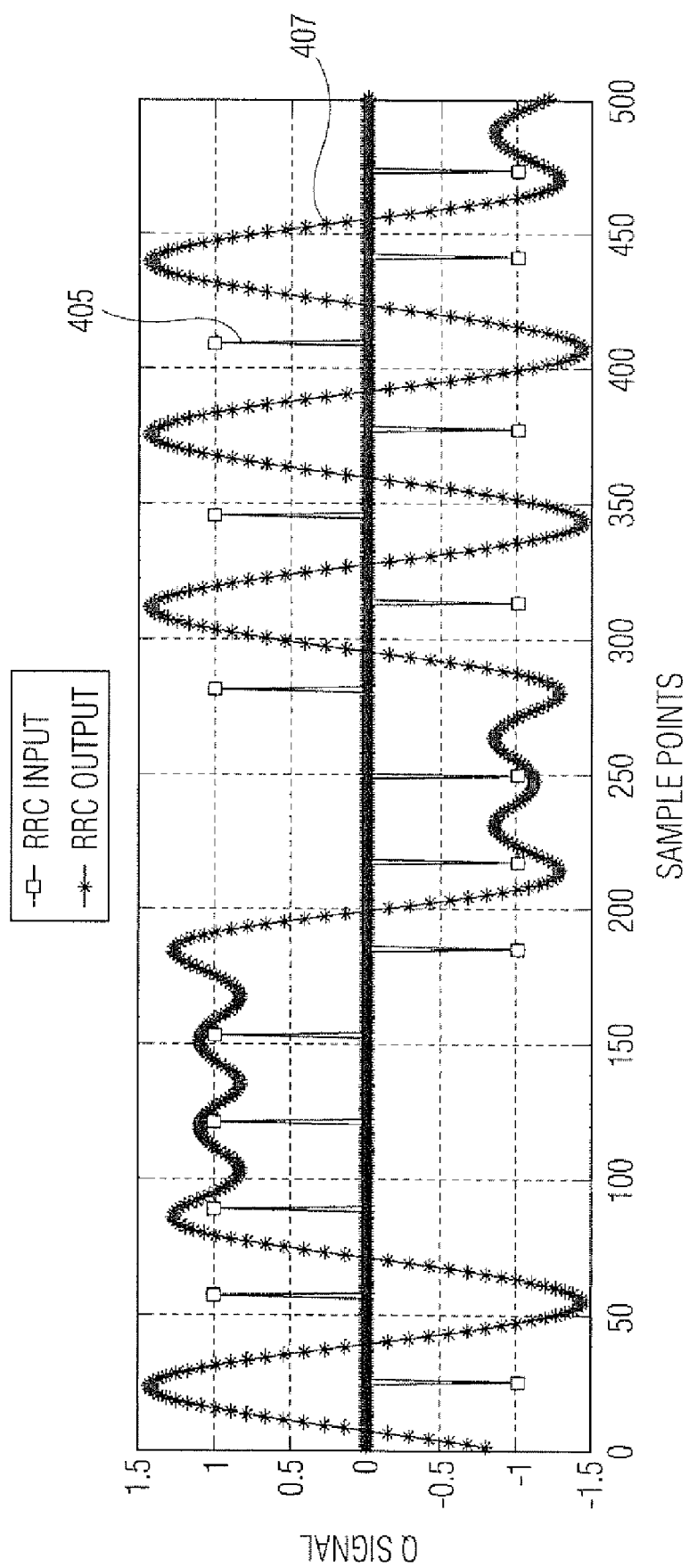
FIG. 4B illustrates a RRC filter response to a quadrature input signal.

FIGS. 4A-4F illustrate exemplary graphs of the respective inputs and outputs of the pulse-shaping filters 315, 319 and the TX modulator 300. As shown in FIGS. 4A-4B, the pulse-shaping filters 315, 319 receive a series of impulses 401, 405 representing the respective I and Q bits produced by the I/Q mapper 301. Pulse-shaping filters 315, 319 may be, for example, root-raised cosine (RRC) filters that may respond to an impulse with a specific impulse response. RRC filters 315, 319 may then produce impulse responses 403, 407 based on the received impulses.

Figure 4C:
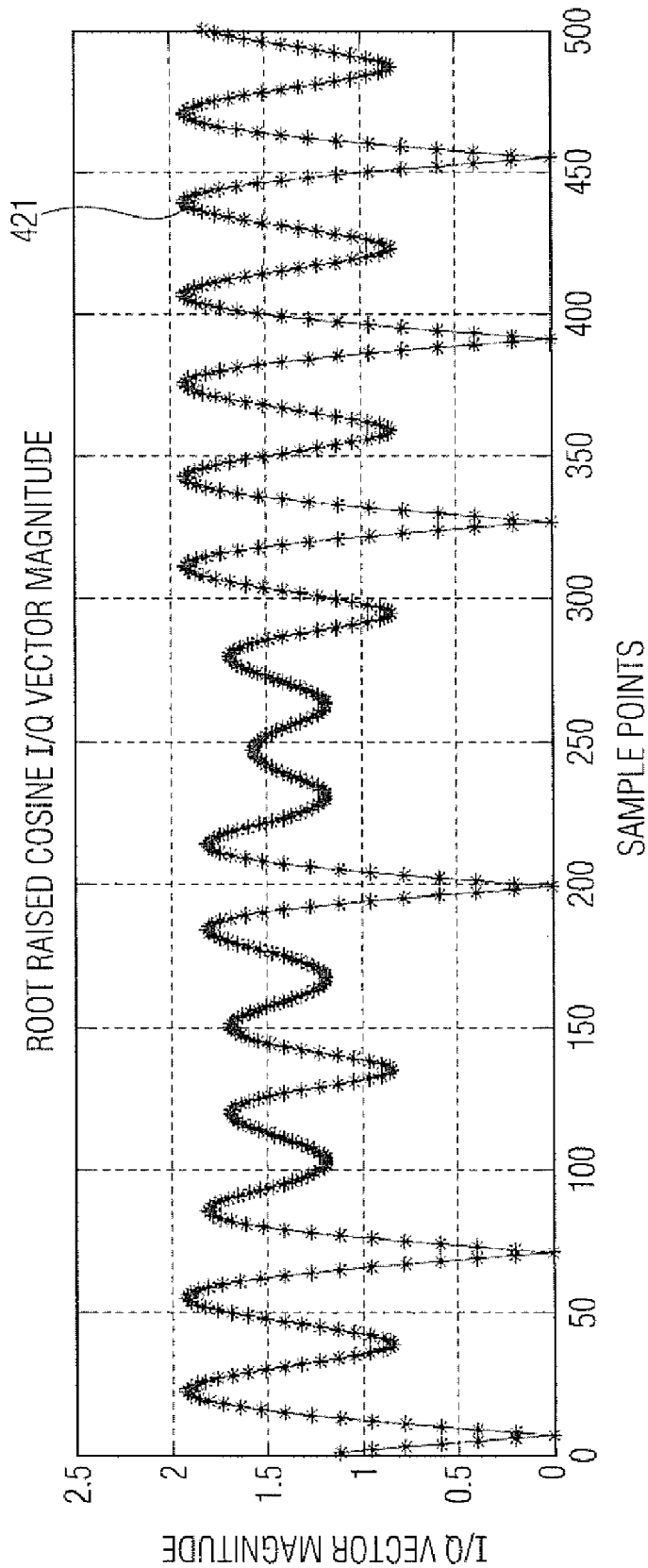
FIG. 4C illustrates the I/Q vector magnitude produced by the in-phase and the quadrature outputs of the RRC filters.
Figure 4D:
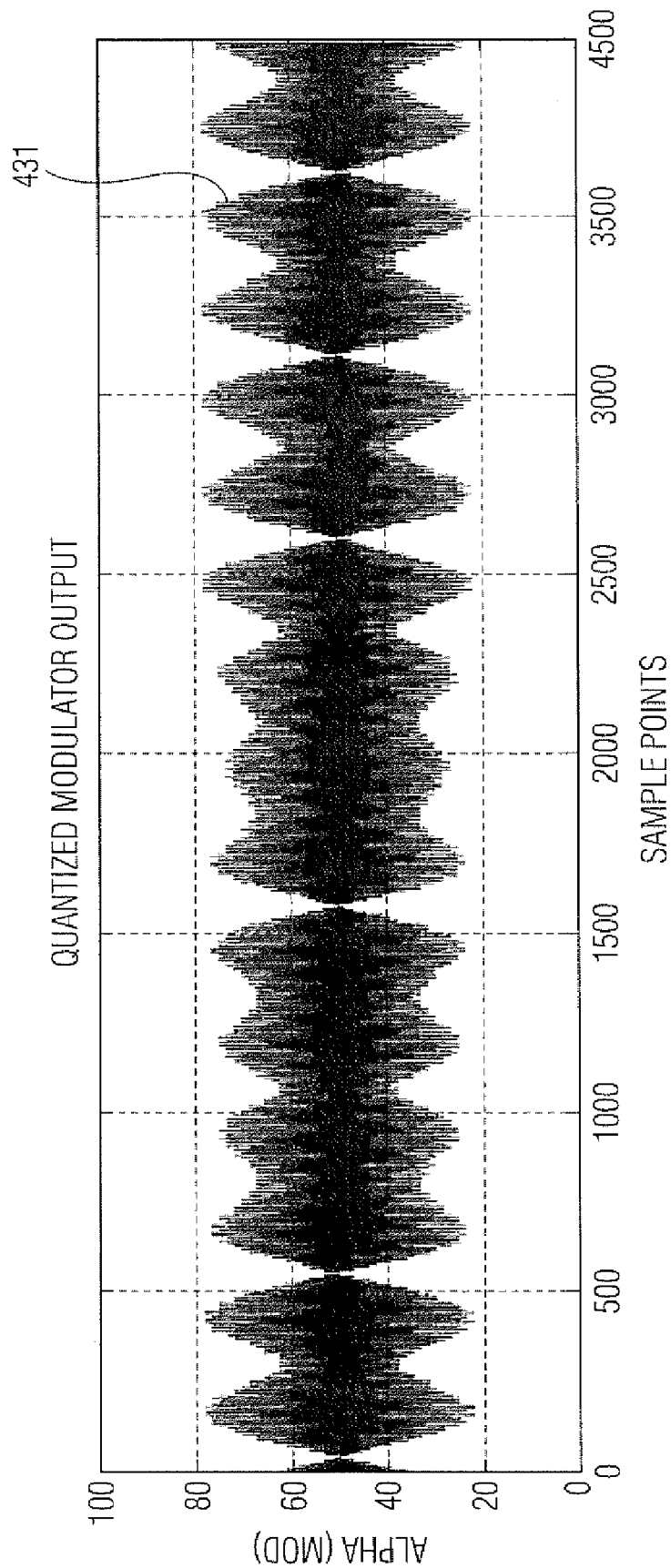
FIG. 4D illustrates a quantized modulator output produced by a modulator.
Figure 4E:
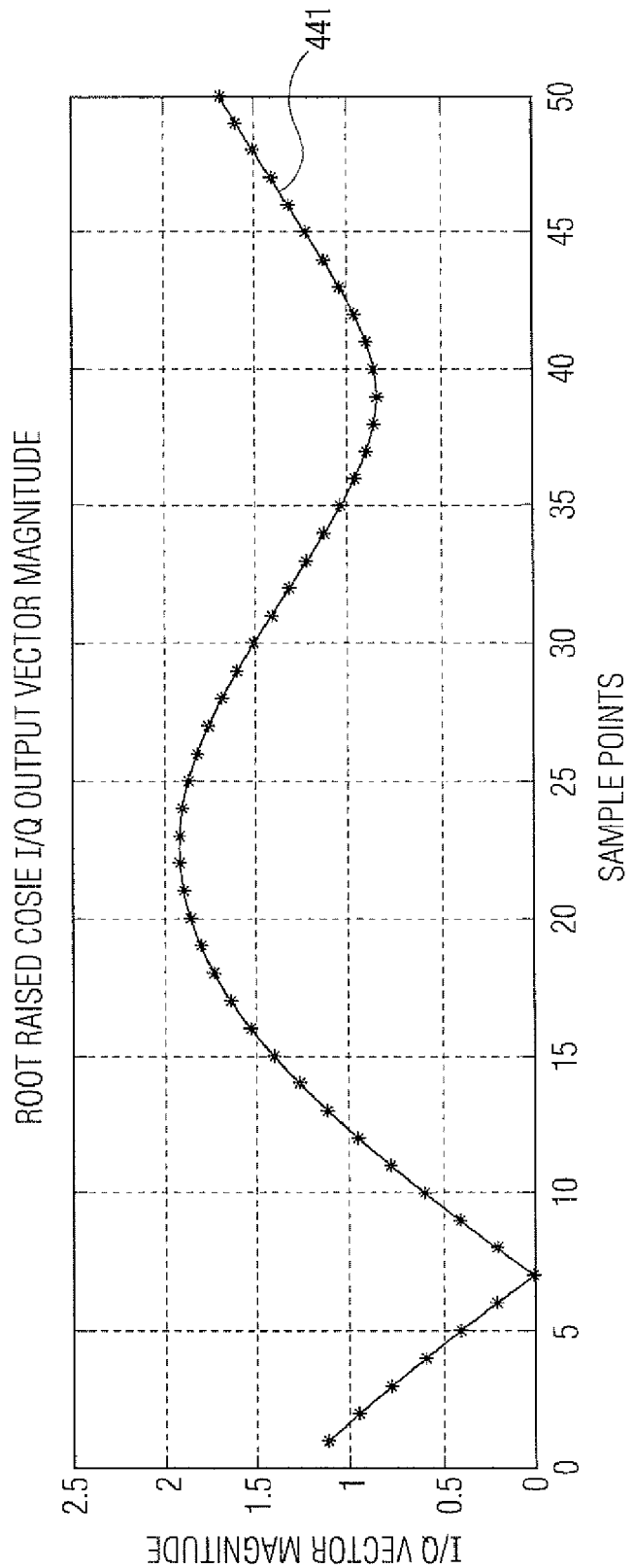
FIG. 4E illustrates another I/Q vector magnitude produced by the in-phase and quadrature outputs of the RRC filters.
Figure 4F:
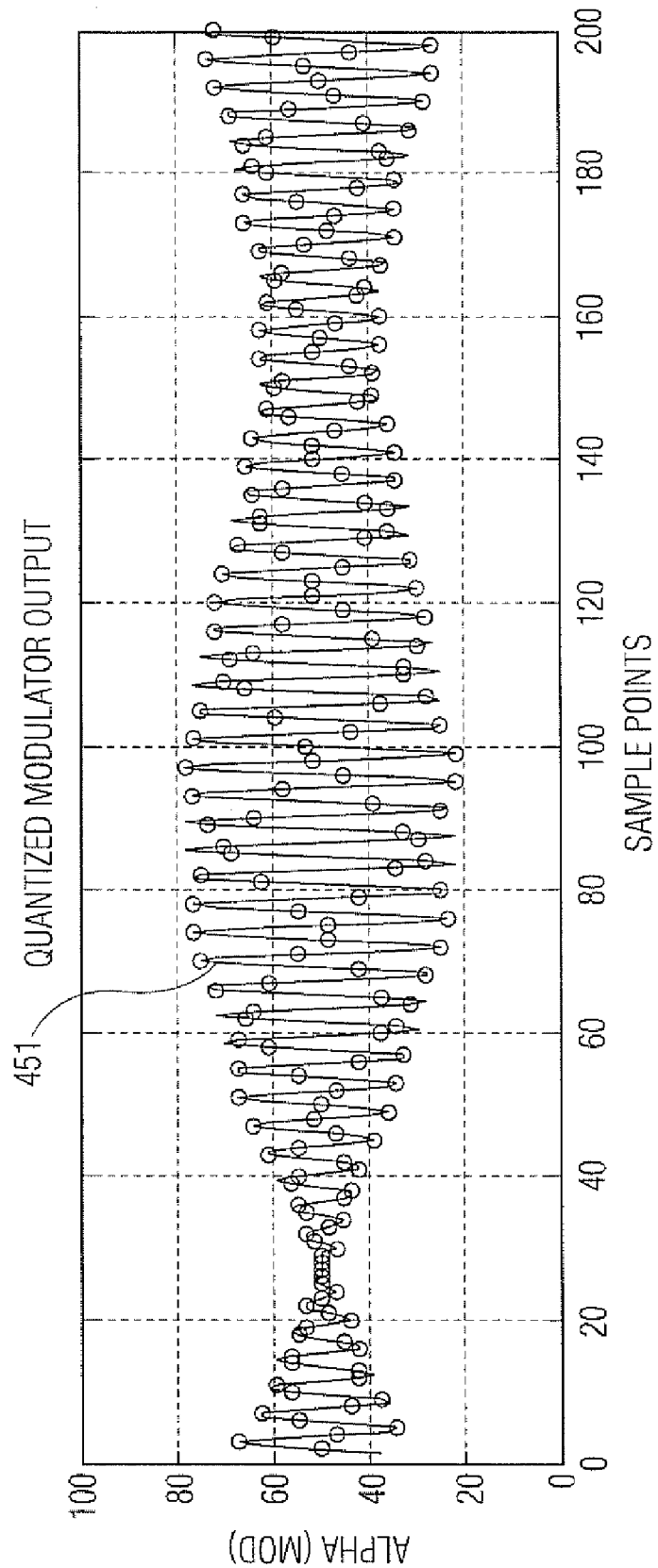
FIG. 4F illustrates another quantized modulator output produced by a modulator.

FIGS. 4C-4D illustrate the magnitude of the I/Q pair vector 421 produced by the in-phase and the quadrature outputs of the pulse-shaping filters 315, 319 and the corresponding shape of the modulation sequence produced by the adder 329. Similarly, FIGS. 4E-4F illustrate the respective I/Q pair vector magnitude 441 and the resultant modulation sequence 451 on a smaller scale. As shown by lines 421, 441 the RRC filters 315, 319 produce filtered I and Q values that result in a shaped frequency response. After multiplying the filtered I and Q values with the oversampled sine and cosine components 356, 358, the TX modulator 300 produces a modulation sequence with an envelope corresponding to the I/Q pair vector magnitude shape 421, 441 of the output of the RRC filters 315, 319. As the modulation sequence directly controls the output signal received by the node 139 and subsequently transmitted by the coil circuit 141, the RRC filters 315, 319 may directly control the shape of the transmission signal sent by the inductor 143, and consequently, the spectrum shape of the transmission signal.

Figure 5:
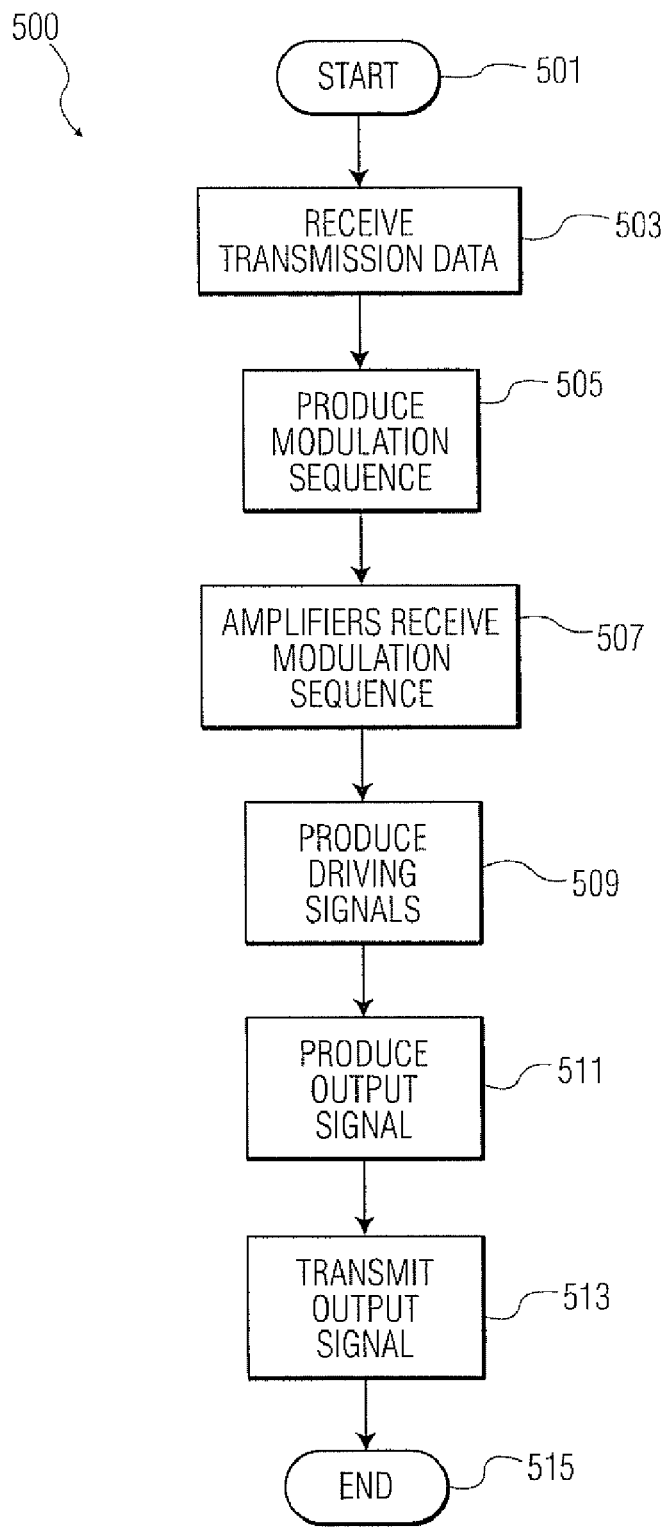
FIG. 5 illustrates an exemplary method for transmission of a shaped carrier signal.

FIG. 5 illustrates an exemplary flowchart for the shaping of a carrier signal for transmission. Method 500 may be employed by the transmission (TX) circuit 100 to transmit a shaped transmission signal based on the output of a TX modulator 300. Method 500 may begin at step 501 and proceed to step 503, where the transmission modulator 300 receives transmission data. I/Q mapper 301 in the TX modulator 300 may receive the transmission data in the form of a sequence of bit groups, such as a sequence of bit pairs. As will be discussed in further detail below in relation to FIG. 6, the TX modulator 300 may then proceed to step 505 by producing a modulation sequence based on the received transmission data. TX modulator 300 may, for example, use an I/Q mapper 301 and one or more pulse-shaping filters 315, 319 to produce an I/Q vector. The filtered I/Q signal may then be modulated on a carrier and the output of the I/Q modulator may be post-processed by components in the TX modulator 300 to produce a scaled modulation value. The modulation value may be in the form of a whole number with a value between zero and the total quantity of switching amplifier stages 110 that are in the TX driving circuit 101. The TX modulator 300 may, for example, generate a modulation sequence as a binary number comprising a control bit for each of the plurality of switching amplifier stages 110, in which the number of active control bits (set to a binary value of 1) may be determined by the scaled modulation value.

In step 507, each of the switching amplifiers 103, 123 in the TX driving circuit 101 may receive the modulation sequence. In some embodiments, each switching amplifier 103, 123 may receive the entire modulation sequence. Upon receipt, each switching amplifier 103, 123 in step 509 may produce a driving signal. When a switching amplifier 103, 123 receives a logic-high bit, the switching amplifier 103, 123 may switch its output to the supply rail. In contrast, when the switching amplifier 103, 123 receives a logic-low bit, the switching amplifier may switch its output to the ground rail. In some embodiments, the output of each of the switching amplifiers 103, 123 receiving a logic-high bit may be the form of a square wave.

In step 511, the TX driving circuit 101 may produce an output signal at the node 139. In some embodiments, the output signal may be in the form of a square wave. In such instances, the capacitor 147 in the coil circuit may form an LC tank with the inductor 143 to that the transmission signal sent by the inductor 143 is in the form of a sine wave. In other embodiments, the capacitors 105, 125 in the first stage and/or the capacitors 111, 131 of the second stage of the switching amplifier stages 110 may be used as additional capacitors, in addition to the capacitor 147, to shape the signal produced by each of the switching amplifiers 103, 123 so that the output signal produced at the node 139 is already in the form of a sine wave. In such instances, the inductor 143 may form an LC tank with a collective of one or more of the capacitors 105, 125, 111, 131, 147.

In step 513, the output signal at the node 139 may be transmitted by the inductor 143 as a transmission signal. In some embodiments, the transmission may be done by an RLC tank formed from the components in the TX circuit 100. In some embodiments, the RLC tank may be formed from the parasitic resistance 145 and the parasitic capacitance 147. The values of the parasitic components may be accounted for and/or tuned so that the inductor 143 transmits at the resonant frequency. In other embodiments, the components of the second stage may be used in conjunction with or in lieu of external components to form the RLC tank. For example, the combination of capacitors 105, 125, 111, 131 may form an equivalent capacitance for the RLC tank. In alternative embodiments, the parasitic capacitance 147 in combination with an additional external capacitor may also be used to form the equivalent capacitance. In some embodiments, an additional antenna might be connected to the coil circuit 141. Method 500 may then end at step 515.

Figure 6:
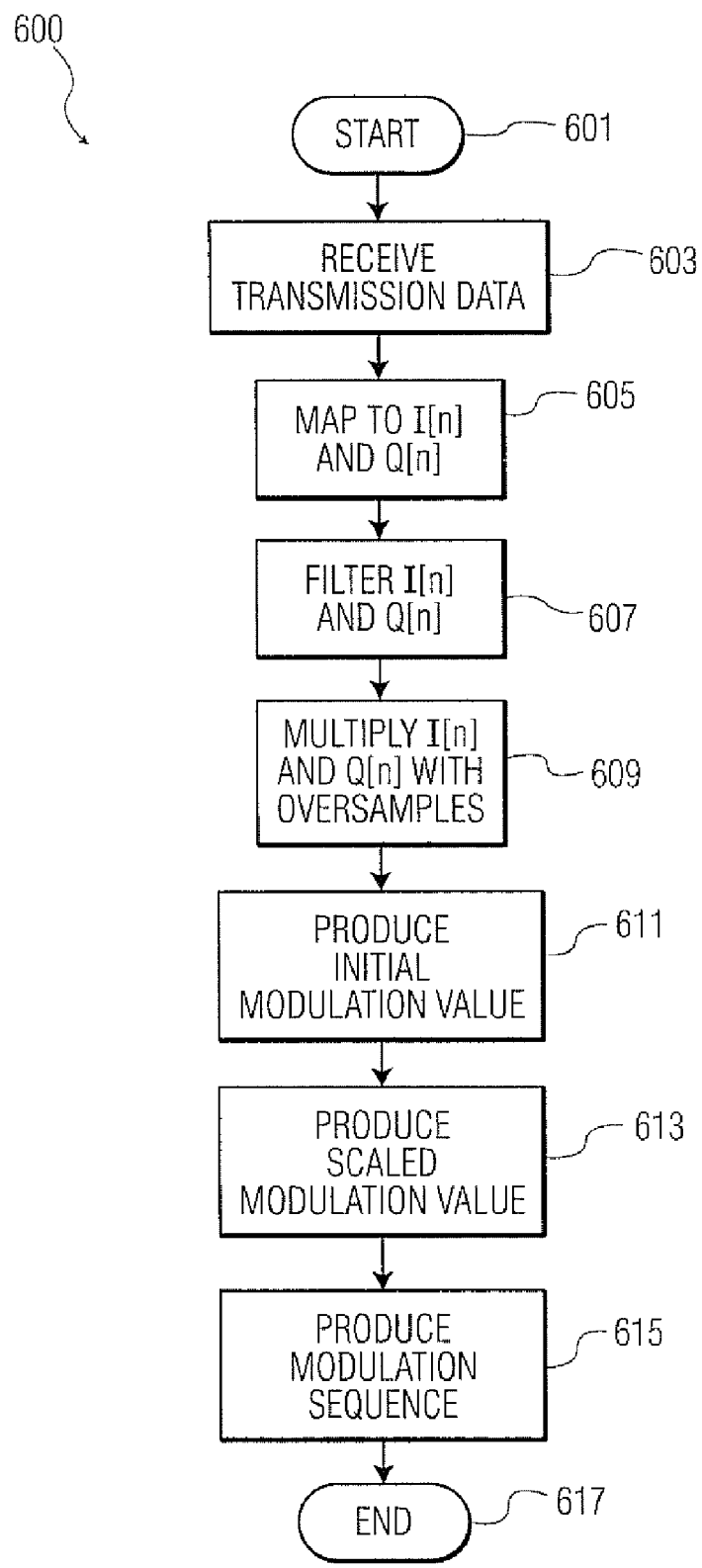
FIG. 6 illustrates an exemplary method for producing a modulation sequence for the transmission circuit.

FIG. 6 illustrates an exemplary method for producing the modulation sequence for the transmission circuit. TX modulator 300 may implement the method 600 to produce a modulation sequence comprising control bits for each of the plurality of switching amplifier stages 110 included in the TX driving circuit 101. In some embodiments, the TX modulator 300 may implement the method 600 multiple times during a carrier period in order to produce multiple modulation sequences. This may cause the TX driving circuit 100 to shape the spectrum of the transmission signal sent by the inductor 143 of the coil circuit 141.

Method 600 may begin at step 601 and may proceed to step 603, where the TX modulator 300 may receive transmission data. In some embodiments, the I/Q mapper 301 included in the TX modulator 300 may receive the transmission data as a sequence of groups, such as pairs, which are received at a given channel rate. In such instances, the I/Q mapper 301 may receive the groups of bits as symbols, with the symbol rate related to the channel rate. For example, the I/Q mapper 301 may receive channel bits at a channel rate of 600 kHz and map the incoming bits as bit pairs on a symbol, leading to a symbol rate of 300 kHz. I/Q mapper 301 may then proceed to step 605, where the incoming bit pairs are mapped to corresponding in-phase (I) and quadrature (Q) phase components.

In step 607, the baseband filter 311 may filter the I and Q components produced in the step 605 by the I/Q mapper 301. In some embodiments, one or more pulse-shaping filters 315, 319 that may comprise one or more root-raised cosine (RRC) filters may filter the I and Q components, which themselves may be oversampled through up-samplers 313, 317 to operate at a defined reference frequency. Baseband filter 311 may produce filtered and I/Q components from one or more pulse-shaping filters 315, 319.

In step 609, the I and Q filtered components may be separately multiplied with oversampled sine and cosine components 356, 358. The oversampled components may scale the filtered I and Q components so the result is normal, inverted, or zero. In some embodiments, the I and Q filtered components may be re-sampled by re-sampler blocks 333, 335 before being multiplied by the oversampled sine and cosine components 356, 358.

Adder 325 may, in step 611, produce an initial modulation value $\alpha_{init}$ based on the values received from the multipliers 321, 323. In some embodiments, the initial modulation value may be a positive or negative fractional number. In some embodiments, a multiplexer may complete steps 609-611 by receiving the filtered I and Q components from the baseband filter 311 and outputting the normal value, inverted, value, or zero based on the oversampling control value that may act as a control signal.

In step 613, the multiplier 327 and the adder 329 may produce a scaled modulation value. Quantizer 331 may then in step 629 quantize the scaled modulation value produced in step 613 to a whole number between zero and the total quantity of switching amplifier stages 110 in the TX driving circuit 101 and create a modulation sequence from this value. In some embodiments, the quantizer 331 may use a thermometer code to create the modulation sequence as a binary value comprising a quantity of logic-high "1" bits corresponding to the scaled modulation value. For example, a scaled modulation value of "4" would be quantized to 11110000 when there is a total of eight switching amplifier stages 110. Accordingly, a fraction of switching amplifiers 103, 123 corresponding to the quantity of logic-high control bits included in the modulation sequence may switch to the supply rail upon receipt of the control bit.

It should be apparent from the foregoing description that various exemplary embodiments of the invention may be implemented in hardware and/or firmware. Furthermore, various exemplary embodiments may be implemented as instructions stored on a non-transitory machine-readable storage medium, which may be read and executed by at least one processor to perform the operations described in detail herein. A non-transitory machine-readable storage medium may include any mechanism for storing information in a form readable by a machine, such as a personal or laptop computer, a server, or other computing device. Thus, a non-transitory machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principals of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. An electrical circuit comprising:
   a plurality of switching amplifier stages, each switching amplifier stage receiving at least one of a plurality of driving controls and producing a shaping signal; and
   a summing node that produces a summing signal from all of the produced shaping signals, wherein the plurality of driving controls determines a spectral content shape of the summing signal by Root-Raised Cosine (RRC) filtering.

2. The electrical circuit of claim 1, further comprising:
   a load connected to the summing node comprising an inductor connected to a resistor and a load capacitor, wherein the inductor, the resistor, and the load capacitor comprise an RLC tank circuit.

3. The electrical circuit of claim 2, wherein the plurality of switching amplifier stages comprise:
   a plurality of switching amplifiers; and
   a plurality of switching amplifier stage capacitors, wherein the inductor, the resistor, and at least the plurality of switching amplifier stage capacitors comprise the RLC tank circuit.

4. The electrical circuit of claim 1, further comprising:
   a modulator that receives transmission data and produces a modulation sequence comprising the plurality of driving controls.

5. The electrical circuit of claim 4, wherein the transmission signal has a period comprising k+1 sub-parts, wherein the modulator produces $\alpha_0$-$\alpha_k$ modulation sequences for a modulation values.

6. The electrical circuit of claim 4, wherein each one of the plurality of driving controls consist of a control bit.

7. A hearing aid device that includes the electrical circuit of claim 1.

8. An electrical circuit comprising:
   a modulator that receives transmission data and produces a modulation sequence comprising a plurality of driving controls, the modulator comprising:
      an I/Q mapper that generates in-phase band (I-band) and quadrature-phase band (Q-band) signals based on the received transmission data,
      at least one filter that receives the I-band and the Q-band signals and produces an I-band filtered signal and a Q-band filtered signal, and
      an I/Q modulator that combines the I-band and the Q-band filtered signals to produce a modulated transmission signal;
   a plurality of switching amplifier stages, each switching amplifier stage receiving at least one of the plurality of driving controls and producing a shaping signal;
   a summing node that produces a summing signal from all of the produced shaping signals, wherein the plurality of driving controls determine a spectral content shape of the summing signal.

9. The electrical circuit of claim 8, wherein the modulator further comprises:
   a quantizer that receives a scaled modulation value based on the modulated transmission signal and produces the modulation sequence.

10. The electrical circuit of claim 8, wherein the modulator further comprises:
    a frequency generator that produces a reference frequency for at least the I/Q mapper or the at least one filter and an oscillator frequency for the I/Q modulator.

11. The electrical circuit of claim 10, wherein the oscillator frequency is locked in at least frequency or phase with the reference frequency.

12. The electrical circuit of claim 8, wherein the modulator further comprises
    a multiplier that receives an initial modulation value from the I/Q modulator and produces a scaled modulation value.

13. The electrical circuit of claim 12, wherein the scaled modulation value is a whole number between zero and the plurality switching amplifier stages.

14. A method comprising:
    receiving, by a plurality of switching amplifier stages, a plurality of driving controls;
    producing, by the plurality of switching amplifier stages, a plurality of shaping signals;
    producing, by the summing node, a summing signal from the plurality of shaping signals, wherein the plurality of driving controls determines a spectral content shape of the summing signal by Root-Raised Cosine (RRC) filtering.

15. The method of claim 14, wherein the summing node connects to a load comprising an inductor connected to a resistor and a load capacitor, wherein the inductor, the resistor, and the load capacitor comprise an RLC tank circuit.

16. The method of claim 15, wherein the plurality of amplifier stages comprise a plurality of switching amplifiers and a plurality of switching amplifier stage capacitors, wherein the inductor, the resistor, and at least the plurality of switching amplifier stage capacitors comprise the RLC tank circuit.

17. The method of claim 14, further comprising:
receiving, by a modulator, transmission data; and
producing, by the modulator, a modulation sequence comprising the plurality of driving controls.

18. The method of claim 17, further comprising:
producing, by the modulator, $\alpha_0$-$\alpha_k$ modulation sequences for a modulation values, wherein the transmission signal has a period comprising k+1 sub-parts.

19. The method of claim 17, wherein the plurality of driving controls each consist of a control bit.

20. A method comprising:
receiving, by a modulator, transmission data; and
producing, by the modulator, a modulation sequence comprising a plurality of driving controls;
receiving, by an I/Q mapper in the modulator, the transmission data;
generating, by the I/Q mapper, in-phase band (I-band) and quadrature-phase band (Q-band) signals;
producing, by at least one filter in the modulator that receives the I-band or the Q-band signal, an I-band filtered signal or a Q-band filtered signal;
combining, by an I/Q modulator in the modulator, the I-band and Q-band filtered signals;
producing, by the I/Q modulator, a modulated transmission signal;
receiving, by a plurality of switching amplifier stages, the plurality of driving controls;
producing, by the plurality of switching amplifier stages, a plurality of shaping signals;
producing, by the summing node, a summing signal from the plurality of shaping signals, wherein the plurality of driving controls determine a spectral content shape of the summing signal.

21. The method of claim 20, wherein the producing step by the modulator further comprises:
receiving, by a quantizer, a scaled modulation value based on a value produced by the I/Q modulator; and
producing, by the quantizer, the modulation sequence.

22. The method of claim 20, further comprising:
producing, by a frequency generator, a reference frequency for at least the I/Q mapper or the at least one filter; and
producing, by the frequency generator, an oscillator frequency for the I/Q modulator.

23. The method of claim 22, wherein the oscillator frequency is locked in at least frequency or phase with the reference frequency.

24. The method of claim 21, further comprising:
receiving, by a multiplier, an initial modulation value from the I/Q modulator; and
producing, by the multiplier, the scaled modulation value.

25. The method of claim 24, wherein the scaled modulation value is a whole number between zero and the plurality of switching amplifier stages.

* * * * *